(12) United States Patent
Mendenhall

(10) Patent No.: US 6,611,169 B2
(45) Date of Patent: Aug. 26, 2003

(54) POWER SUPPLY REGULATION AND PROTECTION CIRCUIT FOR AUDIO POWER AMPLIFIER

(75) Inventor: Eric Mendenhall, Dove Canyon, CA (US)

(73) Assignee: Gibson Guitar Corp., Nashville, TN (US)

( * ) Notice: Subject to any disclaimer, the term of this patent is extended or adjusted under 35 U.S.C. 154(b) by 0 days.

(21) Appl. No.: 10/117,164

(22) Filed: Apr. 5, 2002

(65) Prior Publication Data

US 2003/0062953 A1 Apr. 3, 2003

Related U.S. Application Data

(60) Provisional application No. 60/326,245, filed on Oct. 1, 2001.

(51) Int. Cl.[7] .................................................. H03F 3/52
(52) U.S. Cl. ........................ 330/51; 330/297; 330/298
(58) Field of Search ........................ 330/51, 127, 207 P, 330/297, 298

(56) References Cited

U.S. PATENT DOCUMENTS

| | | |
|---|---|---|
| 3,010,064 A | 11/1961 | Ross |
| 3,487,289 A | 12/1969 | McMurray |
| 4,195,335 A | 3/1980 | Murakami et al. |
| 4,464,634 A | 8/1984 | Velazquez |
| 4,555,672 A | 11/1985 | Segal |
| 4,651,112 A | 3/1987 | Keysor |
| 4,652,769 A | 3/1987 | Smith et al. |
| 4,672,300 A | 6/1987 | Harper |
| 4,677,366 A | 6/1987 | Wilkinson et al. |
| 4,683,529 A | 7/1987 | Bucher, II |
| 4,808,946 A | 2/1989 | Carver et al. |
| 4,831,508 A | 5/1989 | Hunter |
| 4,849,651 A | 7/1989 | Estes, Jr. |
| 4,855,890 A | 8/1989 | Kammiller |
| 4,876,497 A | 10/1989 | Colver |
| 4,947,308 A | 8/1990 | Gulczynski |
| 4,949,234 A | 8/1990 | Gulczynski |
| 4,961,044 A | 10/1990 | Kravitz |
| 4,980,649 A | 12/1990 | Gulczynski |
| 4,980,812 A | 12/1990 | Johnson, Jr. et al. |
| 5,003,454 A | 3/1991 | Bruning |
| 5,006,975 A | 4/1991 | Neufeld |
| 5,012,161 A | 4/1991 | Borowiec et al. |
| 5,075,634 A | 12/1991 | French |
| 5,129,006 A | 7/1992 | Hill et al. |
| 5,155,430 A | 10/1992 | Gulczynski |
| 5,164,656 A | 11/1992 | Gulczynski |
| 5,224,029 A | 6/1993 | Newman, Jr. |
| 5,233,509 A | 8/1993 | Ghotbi |
| 5,267,132 A | 11/1993 | Gulczynski |
| 5,345,164 A | 9/1994 | Lesea |
| 5,396,194 A | 3/1995 | Williamson et al. |
| 5,450,307 A | 9/1995 | Yasumura |
| 5,499,154 A | 3/1996 | Cullison |
| 5,510,753 A | 4/1996 | French |
| 5,532,917 A | 7/1996 | Hung |
| 5,543,753 A | 8/1996 | Williamson |
| 5,563,781 A | 10/1996 | Clauter et al. |
| 5,606,289 A | 2/1997 | Williamson |
| 5,760,652 A | * 6/1998 | Maemura et al. ........... 330/297 |
| 5,767,744 A | 6/1998 | Irwin et al. |
| 5,818,301 A | * 10/1998 | Higashiyama et al. ...... 330/266 |
| 5,859,757 A | 1/1999 | Hanafusa et al. ........... 361/100 |
| 5,932,827 A | 8/1999 | Osborne et al. |
| 5,990,751 A | * 11/1999 | Takita ........................ 330/297 |
| 6,097,249 A | 8/2000 | Strickland et al. |
| 6,417,736 B1 | * 7/2002 | Lewyn ........................ 330/297 |

* cited by examiner

Primary Examiner—Henry Choe
(74) Attorney, Agent, or Firm—Waddey & Patterson; Lucian Wayne Beavers

(57) ABSTRACT

An audio power amplifier including a rail voltage detection circuit connected to a feedback generator and a rail voltage, the detection circuit is adapted to detect an overvoltage or undervoltage condition and control the feedback signal to a regulated switching power supply to adjust the rail voltage. Additional protection is provided through thermal stress detection and output fault detection to control the feedback signal and protect the audio power amplifier.

20 Claims, 4 Drawing Sheets

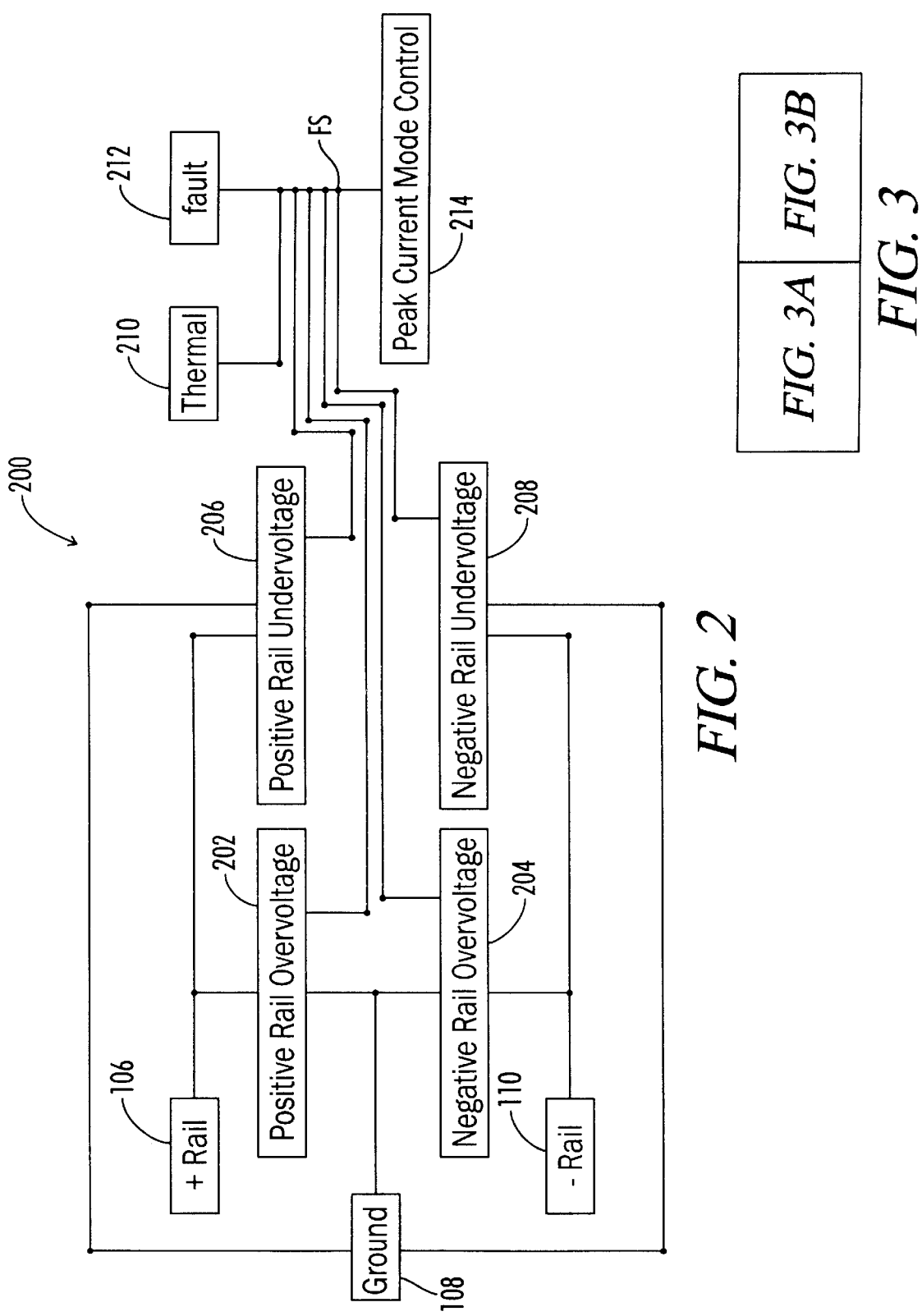

POWER SUPPLY REGULATION AND PROTECTION CIRCUIT FOR AUDIO POWER AMPLIFIER

This application claims benefit of Provisional Application Serial No. 60/326,245 filed Oct. 1, 2001, entitled "Power Supply Regulation and Protection Circuit for Audio Power Amplifier" which is hereby incorporated by reference.

BACKGROUND OF THE INVENTION

The present invention relates generally to audio power amplifiers and more particularly, this invention pertains to audio power amplifiers using feedback signals to control power supply output. It is known in the prior art to use an audio power amplifier powered by a regulated switching power supply with both positive and negative outputs. Due to the nature of an audio power amplifier driving low frequency signals, the positive and negative outputs are loaded sequentially. Due to the nature of a switching power supply, the loaded output's voltage is reduced, or sags, making less power available to the load. In addition to this problem, at the same time the unloaded output's voltage is increased, or floats, which can cause an overvoltage condition and failure of components when their ratings are exceeded. A third problem occurs when the dissipation of the power amplifier is too large for continued operation, as may be caused by excessive ambient temperatures, or by excessive loading of the amplifier. In this situation, an unregulated power supply cannot respond to remedy this condition and typical prior art has involved shutting down the amplifier until it is cool enough to run again. The present invention is directed to these problems.

Several United States Patents discuss the designs of amplifiers or power supplies. These include: U.S. Pat. No. 6,097,249 entitled Method and device for improved class BD amplification having single-terminal alternating-rail dual-sampling topology; U.S. Pat. No. 5,932,827 entitled Sustainer for a musical instrument; U.S. Pat. No. 5,606,289 entitled Audio frequency power amplifiers with actively damped filter; U.S. Pat. No. 5,563,781 entitled Dual-mode power converter; U.S. Pat. No. 5,543,753 entitled Audio frequency power amplifiers with actively damped filter; U.S. Pat. No. 5,532,917 entitled Power factor corrected rectifying circuit; U.S. Pat. No. 5,510,753 entitled Composite bridge amplifier with output overload and thermal protection; U.S. Pat. No. 5,499,154 entitled Protective shut-down system for switch-mode power supply; U.S. Pat. No. 5,450,307 entitled Switching power source apparatus; U.S. Pat. No. 5,396,194 entitled Audio frequency power amplifiers; U.S. Pat. No. 5,345,164 entitled Power factor corrected DC power supply; U.S. Pat. No. 5,267,132 entitled High power switching power supply with high power factor; U.S. Pat. No. 5,233,509 entitled Switch-mode AC-to-DC converter; U.S. Pat. No. 5,224,029 entitled Power factor and harmonic correction circuit including ac startup circuit; U.S. Pat. No. 5,164,656 entitled Switching power supply with constant or sinusoidal input current; U.S. Pat. No. 5,155,430 entitled Switching power supply with constant or sinusoidal input current and with fixed or variable output voltage; U.S. Pat. No. 5,129,006 entitled Electronic audio signal amplifier and loudspeaker system; U.S. Pat. No. 5,075,634 entitled Composite bridge amplifier; U.S. Pat. No. 5,012,161 entitled Power factor correction circuit; U.S. Pat. No. 5,006,975 entitled Power factor correction circuit; U.S. Pat. No. 5,003,454 entitled Power supply with improved power factor correction; U.S. Pat. No. 4,980,812 entitled Uninterrupted power supply system having improved power factor correction circuit; U.S. Pat. No. 4,980,649 entitled Ultra efficient switching power amplifier; U.S. Pat. No. 4,961,044 entitled Power factor correction circuit for power supplies; U.S. Pat. No. 4,949,234 entitled High efficiency power factor correction circuit; U.S. Pat. No. 4,947,308 entitled High power switching power supply; U.S. Pat. No. 4,876,497 entitled Power factor corrector; U.S. Pat. No. 4,855,890 entitled Power factor correction circuit; U.S. Pat. No. 4,849,651 entitled Two-state, bilateral, single-pole, double-throw, half-bridge power-switching apparatus and power supply means for such electronic power switching apparatus; U.S. Pat. No. 4,831,508 entitled Power supply system having improved input power factor; U.S. Pat. No. 4,808,946 entitled Lightweight, high power audio amplifier and power supply; U.S. Pat. No. 4,683,529 entitled Switching power supply with automatic power factor correction; U.S. Pat. No. 4,677,366 entitled Unity power factor power supply; U.S. Pat. No. 4,672,300 entitled Direct current power supply using current amplitude modulation; U.S. Pat. No. 4,652,769 entitled Module power supply; U.S. Pat. No. 4,651,112 entitled Audio amplifier system; U.S. Pat. No. 4,555,672 entitled High-fidelity audio frequency amplifier; U.S. Pat. No. 4,464,634 entitled Audio power amplifier; U.S. Pat. No. 4,195,335 entitled Switching power supply having a wide range input capability; U.S. Pat. No. 3,487,289 entitled Multipurpose Power Converter Circuits; and U.S. Pat. No. 3,010,064 entitled Automatic Power Factor Corrector. Each of these patents is hereby incorporated by reference.

None of these patents disclose or suggest the advantages of the present invention specifically directed to the problems associated with an audio power amplifier. What is needed, then, is a Power Supply Regulation and Protection Circuit for an Audio Power Amplifier.

SUMMARY OF THE INVENTION

The present invention teaches an audio power amplifier including a power supply with a positive and negative rail output. The power supply is regulated by a feedback signal through a peak current mode control system using a voltage error amplifier. The invention utilizes a rail voltage detection circuit connected to a feedback generator and one of the rail voltages. The detection circuit is adapted to detect an overvoltage or undervoltage condition and control the feedback signal to the regulated switching power supply so that the power supply will adjust the rail voltage. Additional protection is provided through thermal stress detection and DC output detection to control the feedback signal and protect the power supply and the audio frequency amplifier.

The novel regulation scheme of the present invention allows partial voltage regulation of multiple outputs without the expense and complexity of a post regulator. Additional regulation is provided for overload and fault protection. The outputs of the power supply are regulated with a non-linear scheme that allows the output of the lowest magnitude, the loaded output, to dominate the control loop. This ensures full peak power operation during each half cycle. This control is allowed unless the higher rail, the unloaded rail, exceeds a maximum limit. If the maximum limit is exceeded, then the loop will regulate a combination of the output voltages to ensure that the maximum limit is not exceeded while still providing as much power as possible to the audio frequency amplifier. Either of these mechanisms is overridden in a non-linear fashion by additional circuitry, which detects the presence of DC on the amplifier output, which indicates a fault that would damage the load if allowed to continue. Finally, additional control input is provided in the form of thermal protection, where the voltage of all outputs is reduced as the thermal limits of power components are approached. This has the effect of lowering the power dissipation in the linear amplifier and the power supply, but does not shut down the amplifier completely. Equilibrium of the regulation scheme may be reached, where the amplifier is operated from the maximum supply voltage possible for given load, ambient, and program conditions.

The voltage regulation scheme of the present invention also protects against amplifier overload when driving impedances lower than recommended. The amplifier usually limits output current, but cannot reduce the supply voltage, leaving the amplifier in a high thermal stress condition. In the present invention, high power dissipation will cause the thermal feedback circuit to reduce the rail voltages, which in turn reduces the amplifier dissipation, protecting the amplifier without shutting it down. Thus, the dissipation is reduced by allowing the supply voltage to be reduced in response to an overload, thereby reducing the thermal stress in the output stage.

These and other advantages may be understood by reviewing the following detailed description of the preferred embodiment of the invention.

BRIEF DESCRIPTION OF THE DRAWINGS

FIG. 2 is a block diagram of the protection circuits for monitoring the power supply rail voltages, the amplifier thermal stress, and the amplifier overload.

DESCRIPTION OF THE PREFERRED EMBODIMENTS

Figure 1:
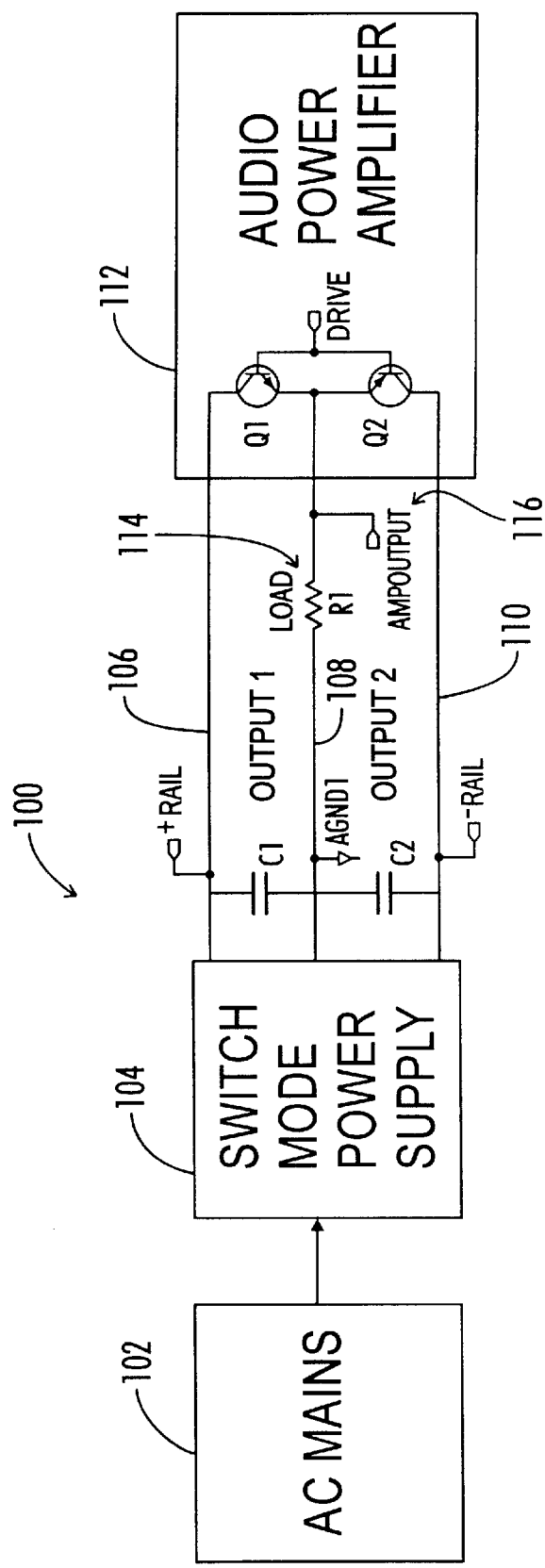
FIG. 1 is a block diagram of a switchmode power supply connected to an audio amplifier showing the voltage rails for attachment of the present invention.

FIG. 1 of the drawings shows a connection of the AC mains 102 to the switch mode power supply 104 connected across capacitors C1 and C2 for powering the load 114 through the audio power amplifier 112. The audio power amplifier 112 is connected to the load 114 such that the amplifier output 116 will power the load with reference to ground 108. However, the present description is not meant to limit the application of the present invention to a particular class or type of amplifier. The switch mode power supply 104 supplies positive rail 106 and negative rail 110 power to the audio power amplifier 112. The improvements of the present invention are made in providing beneficial feedback for powering an audio power amplifier from the switch mode power supply 104.

Figure 3A:
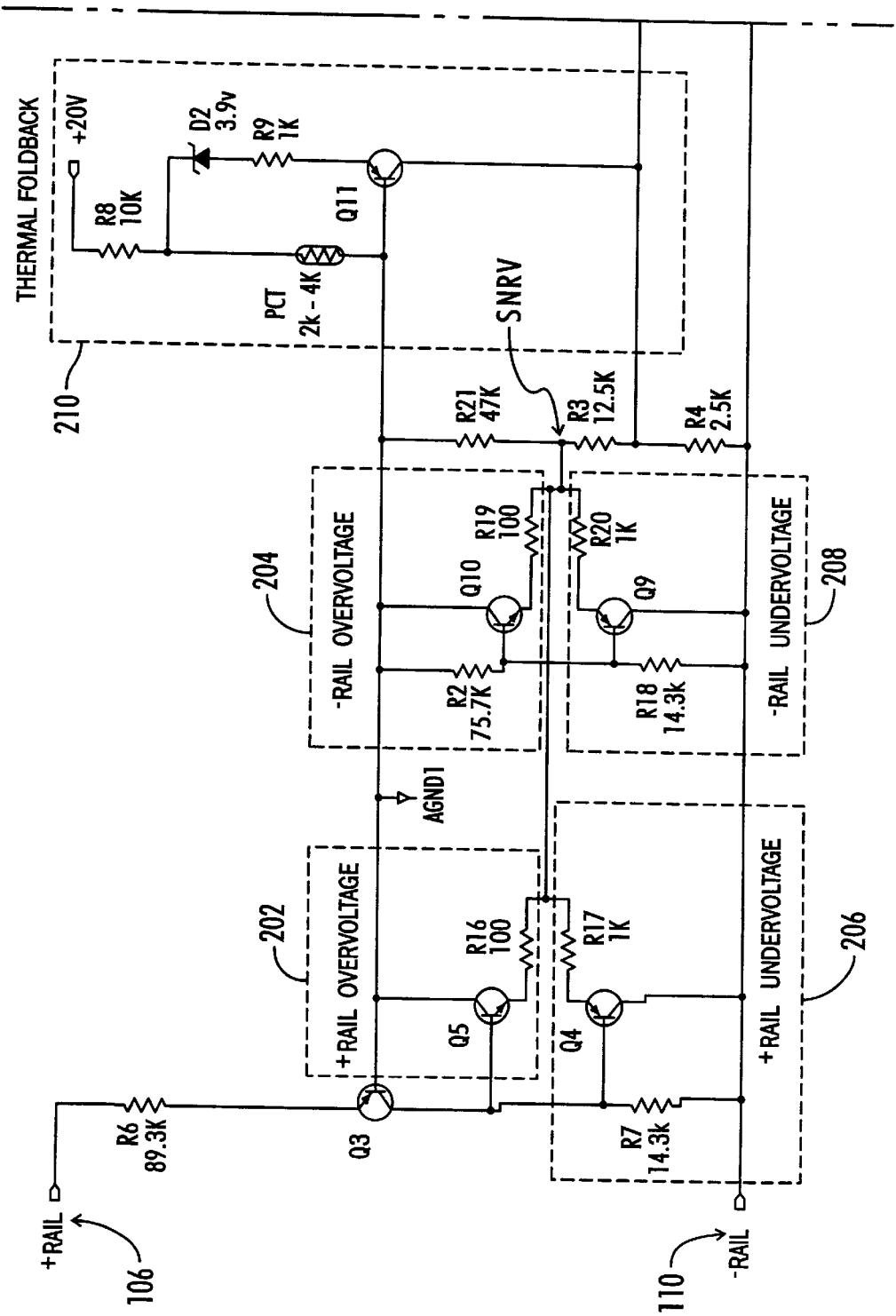
FIGS. 3A and 3B are electrical schematics of the preferred embodiments of the detection circuits.
Figure 3B:
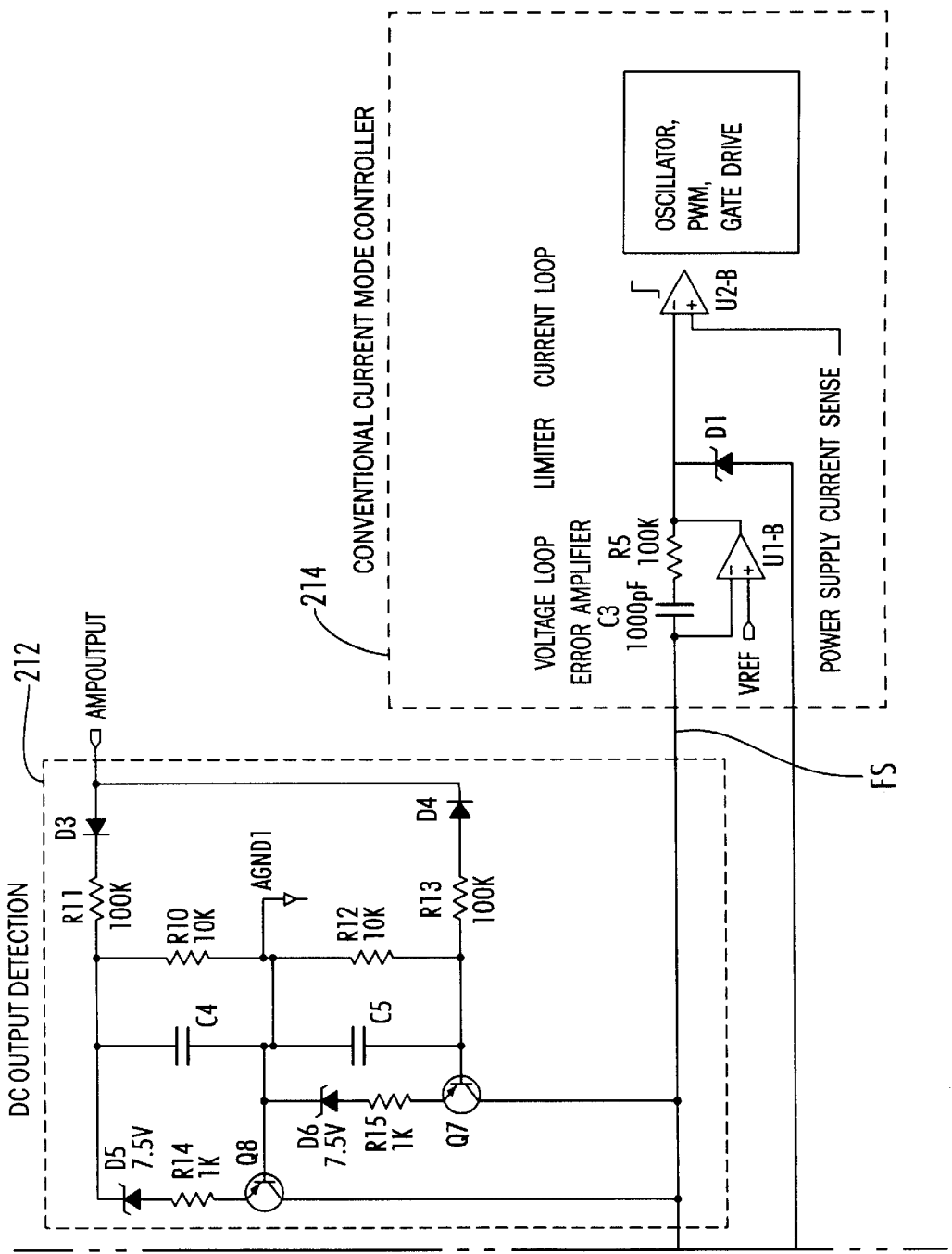

Referring to FIG. 1 of the drawings, the audio power amplifier 100 has an AC output 116. During positive output voltage half cycles, Q1 draws current from C1 into the load 114. Q2 is off, and there is no current draw from C2. Under these conditions, C1's voltage will tend to decrease and C2's voltage will tend to increase. A similar problem may be seen for the negative voltage half cycle with Q2 drawing current from C2. As shown in FIG. 3, the present invention is designed to alleviate these problems by regulating the feedback signal FS used by a switching power supply 104 with a peak current mode control system 214. All of the voltage control loop improvements shown in the present embodiment take place prior to a conventional voltage error amplifier, U1-B.

FIG. 2 of the drawings shows the layout of the present invention. The power supply outputs including the positive rail 106, the negative rail 110, and a ground reference midpoint voltage 108 are connected to a positive rail 106 overvoltage detection circuit 202, a positive rail 106 undervoltage detection circuit 206, a negative rail 110 overvoltage detection circuit 204, and a negative rail 110 undervoltage detection circuit 208 which adjust the feedback signal FS provided to the peak current mode control 214 for the switchmode power supply 104 to adjust the operation of the power supply 104. Additionally, a thermal detection circuit 210 and a fault detection circuit 212 also adjust the feedback signal FS for the peak current mode control 214 for the switchmode power supply 104 to thereby adjust the operation of the power supply 104. The circuit designs for the detection circuits 202, 204, 206, 208, 210, 212 are shown in FIG. 3.

As seen in the preferred embodiment shown in FIG. 3, the detection circuits 202, 204, 206, 208, 210, 212 are connected to the positive rail 106 and the negative rail 110 of a switchmode power supply 104 providing a positive rail 106 voltage of 90 volts DC and a negative rail 110 voltage of negative 90 volts DC. Components of the peak current mode control 214 of the switchmode power supply 104 are shown to explain the operation of the present invention. The peak current mode control 214 uses an operational amplifier U1-B configuration that adjusts the operation of the switchmode power supply 104 to keep the voltage cross R4 equal to its reference voltage, VREF. In this case, that is 2.5 volts. Due to the consistent current flow through R4 and R3, this means that there is 12.5 volts across R3, for a total of 15 volts at the R3/R21 junction, hereafter referred to as the summing node reference voltage SNRV. By adjusting the voltage at this summing node SNRV, the output of the switchmode power supply 104 can be adjusted.

Negative Rail 110 Undervoltage Monitoring

The negative rail 110 undervoltage detection circuit 208 operates by balancing the input bias for a negative rail undervoltage transistor Q9 at the appropriate negative rail 110 voltage. The voltage divider formed by R2 and R18 divides the negative 90 volt rail voltage into negative 75.7 volts across resistor R2 and negative 14.3 volts across resistor R18. As previously noted, the feedback circuit with operation amplifier U1-B will hold the voltage on R4 to negative 2.5 volts. This means that the proportional voltage at point SNRV is held at negative 15 volts. Because the negative reference voltage at point SNRV in the circuit is balanced at negative 15 volts, a 0.7 volt bias in placed on transistor Q9. Thus, negative 90 volts balances the circuit at the bias voltage for the transistor Q9. This balance provides negative 90 volts as the changeover voltage for the operation of the negative undervoltage detection circuit 208. As may be understood by the following explanation, decreases in the negative 90 volts rail voltage (such as negative 85 volts) provides for an increase in the conduction of transistor Q9.

If the voltage between the negative rail 110 and the midpoint voltage 108 drops below negative 90 volts, then the voltage across R18 tries to drop below 14.3 volts. This increases the bias across transistor Q9 and thereby increases the current flow at the base of the transistor Q9 which increases the current flow along the collector-emitter path through the transistor Q9. This increase in current flow will pull down on the reference voltage SNRV and correspondingly reduce the feedback signal FS provided to the voltage control loop. The power supply will then increase its output to raise the negative rail 110 voltage to compensate for this drop in the feedback signal FS. Thus, an undervoltage occurring only on the negative rail 110 is detected by the power supply 104 which increases the power supplied to the amplifier 112 to compensate for the undervoltage.

The undervoltage detection circuit 208 will not affect an overvoltage condition. If the voltage on the negative rail 110 increases above negative 90 volts (for example, negative 95 volts), then the voltage across resistor R18 will increase in magnitude to reduce the bias on the base of transistor Q9. Once this bias is reduced, transistor Q9 will reduce and/or eliminate its output to become non-conductive. Thus, transistor Q9 does not conduct when the difference between the midpoint voltage and the negative rail 110 is greater than the desired negative 90 volts and the undervoltage detection circuit 208 does not interfere with the operation of the overvoltage detection circuit 204.

Negative Rail 110 Overvoltage Monitoring

The negative rail 110 overvoltage detection circuit 204 operates by balancing the input bias on its negative rail overvoltage transistor Q10 at the appropriate positive rail 106 voltage. As previously noted, the voltage divider formed by R2 and R18 divides the negative 90 volt rail voltage into negative 14.3 volts across resistor R18 and negative 75.7 volts across resistor R2. The feedback circuit with operation amplifier U1-B will again hold the voltage on R4 to negative 2.5 volts and the proportional voltage at point SNRV is held at negative 15 volts. Because the reference voltage at point SNRV in the circuit is balanced at negative 15 volts, a 0.7 volt bias in placed on transistor Q10. Thus, negative 90 volts is also the changeover voltage for providing the necessary bias for the transistor Q10. If the voltage between the positive rail 106 and the midpoint voltage increases in magnitude above the negative 90 volts (for example, negative 95 volts), then the voltage across R2 will attempt to increase above 75.7 volts. This increases the bias on Q10 and increases the current flow at the base of the transistor Q10 which increases the current flow through the collector-emitter flow of transistor Q10. This increase in current flow will pull up on the reference voltage SNRV and correspondingly increase the feedback signal FS provided to the voltage control loop. Thus, the power supply 104 will reduce its output to lower the negative rail 110 voltage to compensate for this increase in the feedback signal FS. The negative rail overvoltage detection circuit 204 will not operate when the voltage on the negative rail 110 is less than 90 volts due to the reduced bias provided to the transistor Q10. Thus, transistor Q9 does not conduct when the difference between the midpoint voltage and the negative rail 110 is less than the desired negative 90 volts and the negative rail overvoltage detection circuit 204 does not interfere with the operation of the negative rail undervoltage detection circuit 208.

Positive Rail 106 Undervoltage Monitoring

The overvoltage and undervoltage positive rail 106 detection circuits 202, 206 balance the bias of transistors Q4 and Q5. The positive rail 106 undervoltage circuit 206 balances the bias of positive rail undervoltage transistor Q4 and the positive rail 106 overvoltage circuit 202 balances the bias of positive rail overvoltage transistor Q5. Transistor Q3 provides the positive rail 106 conversion for use with the negative summing node SNRV for the overvoltage and undervoltage positive rail 106 detection circuits 202, 204. Resistor R6 provides for a balanced voltage of 89.3 volts at the collector of transistor Q3. This current flow will also result in a voltage of 14.3 volts across resistor R7.

If the voltage on the positive rail 106 decreases below 90 volts, then the voltage across resistor R6 falls and the bias of transistor Q3 is reduced. The reduction of bias on the transistor reduces the current flow through the R6, Q3, R7 series to reduce the voltage across R7. The reduction of R7 voltage increases the bias across transistor Q4 to increase the current flow through R17 to pull down on the reference voltage SNRV. This reduces the feedback signal FS and the power supply 104 increases its output on the positive rail 106 voltage to compensate. This decreased voltage across R7 also decreases the bias on Q5 to reduce and disable the effect of the positive rail 106 overvoltage detection circuit 202.

Positive Rail 106 Overvoltage Monitoring

If the voltage on the positive rail 106 increases, this will attempt to increase the current through the R6/Q3/R7 connection to increase the bias on transistor Q3. Thus, transistor Q3 become more conductive to allow for the increased current through the R6/Q3/R7 connection. This increased current increases the voltage on R7 and the resulting bias on Q5 to increase the current flow through R16 and pull up on the reference voltage SNRV. This results in an increased feedback signal FS that is interpreted by the power supply to reduce the positive rail 106 voltage. This increased voltage on R7 also reduces the bias on Q4 to decrease and/or stop the effect of the positive rail 106 undervoltage protection circuit 206 on the reference voltage SNRV.

In this manner, both the negative rail 110 and the positive rail 106 are monitored for overvoltage and undervoltage conditions. The overvoltage and undervoltage circuits 202, 204, 206, 208 will operate together to balance the summing node reference SNRV voltage to control the power supply 104 for the best possible operation of the audio frequency amplifier 112.

The present invention also provides a thermal feedback circuit 210, a DC output detection circuit 212, and a power supply output current limit, represented by zener diode D1. High power dissipation will cause the thermal feedback circuit 210 to reduce the rail 106, 110 voltages, which in turn reduces the amplifier 112 dissipation, protecting the amplifier 112 without shutting it down. A DC voltage present on the output of the amplifier 112 indicates that the amplifier 112 had failed, and the DC can destroy the load 114 if the situation is not corrected. The DC detector 212 essentially shuts down the power supply 104 output, allowing it to drop to zero, thus removing the DC from the amplifier 112 and the load 114. This protects the load 114 after the amplifier 112 has already failed. Low impedance load protection is realized by the current limited output of the switching power supply 104 with the limiter shown as zener diode D1. Zener diode D1 limits the maximum current output of the power supply 104.

Amplifier Thermal Stress Monitoring

The thermal feedback protection circuit 210 is implemented by pulling up on the summing node in accordance with the temperature sensing thermistor RTC. The thermal feedback protection circuit 210 uses a positive temperature coefficient thermistor PTC to monitor the temperature of the audio power amplifier 112. In this case, the thermistor PTC varies from 2,000 Ohms cold to 4,000 Ohms hot, and provides a variable voltage to the D2, R9, Q6 string. When the thermistor PTC is cool the thermistor PTC has a resistance of around 2 k Ohms. This results in a voltage that is unable to overcome the bias necessary to conduct across D2 to enable the thermal detection transistor Q6. However, as the thermistor PTC heats up, its resistance increases to a level that will overcome the bias voltage of D2 and bias the thermal detection transistor Q6 into conduction. Until the threshold voltage defined by D5 is overcome, this circuit does not affect the feedback signal FS to adjust the output voltage to the amplifier.

As noted in the following discussion, once the thermal detection transistor Q6 begins to conduct, it pulls up on the feedback signal FS to thereby reduce the power output of the power supply 104. When the thermistor resistance gets up to around 3,000 ohms, current begins to flow through Q6's collector, lowering the regulated power supply output voltage. Thus, as a greater amount of heat is applied to the thermistor PTC by the amplifier 112, the power supply 104 will reduce the power supplied to the amplifier 112. This allows for an equilibrium to be established that allows for controlled amplifier 112 operation at the increased temperature that will limit the power supply 104 to avoid thermal breakdown of the audio power amplifier 112. If the thermistor PTC should get to 4,000 ohms, the thermal limit has been reached and the power supply 104 voltage output will be lower than the amplifier 112 under voltage lockout, effectively forcing a shutdown. When the power supply output voltage is reduced, the amplifier gain may also be reduced by well known means in order to avoid excessive clipping or compression.

Load Protection Under Amplifier Fault Conditions

The amplifier fault DC output detection circuit 212 is formed by two additional similar circuits, which are current sources with a threshold voltage set by zeners D5 and D6. The amplifier fault DC output detector 212 monitors the DC component of the amplifier 112 power output. The amplifier's 112 output is rectified by D3 and D4 to charge capacitors C4 and C5. On a positive DC output, C4 is charged. Then, on the negative cycle, C4 discharges through R10. Thus, as long as the charge applied during the positive cycle can be discharged during the negative cycle, no long term charge is built upon C4. However, if the charge applied to C4 during the positive cycle cannot be discharged during the time of the negative cycle, then the charge will be carried over as a base voltage to the next positive cycle. If the DC output persists, then the capacitor C4 will continue to build a charge until the voltage on C4 exceeds the bias for the zener D5, resistor R14, overload output transistor Q6 series. Once this bias is exceeded, transistor Q6 will conduct to pull up the feedback signal and reduce the voltage supplied to the amplifier, effectively shutting it down and removing the DC output from the load, thus protecting the load from failure. A similar sequence occurs for the negative cycle to bias capacitor C5.

Amplifier Protection Under Low Impedance Load Conditions

Low impedance load protection is realized by the current limited output of the switching power supply 104 with the limiter shown as zener diode D1. Zener diode D1 limits the maximum current output of the power supply 104. The current limiting zener diode D1 follows the voltage loop, and is set up by the relative scaling of the current loop clamping voltage across diode D1. The voltage loop output voltage determines the current output of the power supply 104, and is clamped by D1. The voltage at this limit is set so that it is sufficient to allow desired operation into the minimum recommended load 114. When the load impedance is reduced below this, the reference voltage SNRV is increased to the point where D1 takes over and the power supply voltage loop through U1-B is inactive. In this case, the supply 104 becomes a current source, allowing output voltage to fall. This in turn limits the voltage available to drive a load, protecting the amplifier 112 and the power supply 104 from the overload while reducing the amplifier dissipation drastically by causing the amplifier to operate efficiently, near clip, rather than in a highly dissipative linear region.

Thus, although there have been described particular embodiments of the present invention of a new and useful Power Supply Regulation and Protection Circuit for Audio Power Amplifier, it is not intended that such references be construed as limitations upon the scope of this invention except as set forth in the following claims.

What is claimed is:

1. An apparatus for amplifying an audio signal, comprising:
   a regulated switching power supply adapted to produce a positive and negative rail voltages in relation to a midpoint voltage, the regulated switching power supply including a peak current mode control system using a voltage error amplifier adapted to receive a feedback signal;
   an audio frequency amplifier electrically connected to the midpoint and rail voltages of the regulated switching power supply and adapted to receive and amplify the audio signal;
   a feedback generator connected between at least one rail and the midpoint voltage, the feedback generator adapted to proportionally divide the voltage between the midpoint voltage and the rail voltage to generate the feedback signal and a reference voltage; and
   a rail overvoltage detection circuit connected to the feedback generator and at least one rail voltage, the rail overvoltage detection circuit adapted to detect an overvoltage on the at least one rail voltage and adjust the feedback generator's reference voltage to control the feedback signal such that the regulated switching power supply will adjust the at least one rail voltage.

2. The apparatus of claim 1, further comprising:
   a rail undervoltage detection circuit connected to the feedback generator and at least one rail voltage, the rail undervoltage detection circuit adapted to detect an undervoltage on the at least one rail voltage and adjust the feedback generator's reference voltage to control the feedback signal such that the regulated switching power supply will adjust the at least one rail voltage.

3. The apparatus of claim 2, further comprising:
   a thermal fault detection circuit connected to the voltage generator and adapted to detect a thermal overload on the amplifier and adjust the feedback generator's reference voltage to control the feedback signal such that the regulated switching power supply will lower the rail voltage to protect the amplifier.

4. The apparatus of claim 3, further comprising:
   a fault detection circuit adapted to detect DC output voltage on the amplifier and adjust the feedback generator's reference voltage to control the feedback signal such that the regulated switching power supply will lower the rail voltage to shutdown the amplifier, thus removing the DC and protecting the load from failure.

5. The apparatus of claim 2, further comprising:
   a power supply output current limiting mechanism connected to the power supply and adapted to transition the power supply from a voltage source to a current source such that the rail voltage provided to the amplifier may be reduced under low impedance load conditions.

6. The apparatus of claim 1, further comprising:
a thermal fault detection circuit connected to the feedback generator and at least one rail voltage, the rail thermal fault detection circuit adapted to detect a thermal overload on the amplifier and adjust the feedback generator's reference voltage to control the feedback signal such that the regulated switching power supply will lower the rail voltage to protect the amplifier.

7. The apparatus of claim 6, further comprising:
a fault detection circuit connected to the feedback generator and at least one rail voltage, the fault detection circuit adapted to detect a low impedance load on the amplifier and adjust the feedback generator's reference voltage to control the feedback signal such that the regulated switching power supply will lower the rail voltage to protect the amplifier.

8. The apparatus of claim 1, further comprising:
a fault detection circuit connected to the feedback generator and at least one rail voltage, the fault detection circuit adapted to detect a low impedance load on the amplifier and adjust the feedback generator's reference voltage to control the feedback signal such that the regulated switching power supply will lower the rail voltage to protect the amplifier.

9. The rail overvoltage detection circuit adapted to monitor the negative rail, the rail overvoltage detection circuit comprising:
   a resistor and the collector-emitter flow of a transistor electrically connected between the proportional reference voltage and the negative rail; and
   a voltage divider electrically connected to the base of the transistor and further connected between the midpoint voltage and the rail voltage, the voltage divider adapted to increase transistor bias to increase current flow and reduce the proportional reference voltage in the voltage regulator and thereby adjust the feedback generator's reference voltage to control the feedback signal.

10. An apparatus for amplifying an audio signal, comprising:
   a regulated switching power supply adapted to produce a positive and negative rail voltages in relation to a midpoint voltage, the regulated switching power supply including a peak current mode control system using a voltage error amplifier adapted to receive a feedback signal;
   an audio frequency amplifier electrically connected to the midpoint and rail voltages of the regulated switching power supply and adapted to receive and amplify the audio signal;
   a feedback generator connected between at least one rail and the midpoint voltage, the feedback generator adapted to proportionally divide the voltage between the midpoint voltage and the rail voltage to generate the feedback signal and a proportional reference voltage; and
   a rail undervoltage detection circuit connected to the feedback generator and at least one rail voltage, the rail undervoltage detection circuit adapted to detect an undervoltage on the at least one rail voltage and adjust the feedback generator's reference voltage to control the feedback signal such that the regulated switching power supply will adjust the at least one rail voltage.

11. The apparatus of claim 10, further comprising:
a thermal fault detection circuit connected to the feedback generator and at least one rail voltage, the rail thermal fault detection circuit adapted to detect a thermal overload on the amplifier and adjust the feedback generator's reference voltage to control the feedback signal such that the regulated switching power supply will lower the rail voltage to protect the amplifier.

12. The apparatus of claim 11, further comprising:
a fault detection circuit connected to the feedback generator and at least one rail voltage, the fault detection circuit adapted to detect a low impedance load on the amplifier and adjust the feedback generator's reference voltage to control the feedback signal such that the regulated switching power supply will lower the rail voltage to protect the amplifier.

13. The apparatus of claim 10, further comprising:
a fault detection circuit connected to the feedback generator and at least one rail voltage, the fault detection circuit adapted to detect a low impedance load on the amplifier and adjust the feedback generator's reference voltage to control the feedback signal such that the regulated switching power supply will lower the rail voltage to protect the amplifier.

14. The apparatus of claim 10, further comprising:
a transistor biased by a voltage divider, the transistor adapted to decrease the feedback signal in response to the rail undervoltage.

15. An apparatus for amplifying an audio signal, comprising:
   a regulated switching power supply adapted to produce a positive and negative rail voltages in relation to a midpoint voltage, the regulated switching power supply including a peak current mode control system using a voltage error amplifier adapted to receive a feedback signal;
   an audio frequency amplifier electrically connected to the midpoint and rail voltages of the regulated switching power supply and adapted to receive and amplify the audio signal;
   a feedback generator connected between at least one rail and the midpoint voltage, the feedback generator adapted to proportionally divide the voltage between the midpoint voltage and the rail voltage to generate the feedback signal and a proportional reference voltage; and
   a thermal fault detection circuit connected to the feedback generator and at least one rail voltage, the rail thermal fault detection circuit adapted to detect a thermal overload on the amplifier and adjust the feedback generator's reference voltage to control the feedback signal such that the regulated switching power supply will lower the rail voltage to protect the amplifier.

16. The apparatus of claim 15, further comprising:
a fault detection circuit connected to the feedback generator and at least one rail voltage, the fault detection circuit adapted to detect a low impedance load on the amplifier and adjust the feedback generator's reference voltage to control the feedback signal such that the regulated switching power supply will lower the rail voltage to protect the amplifier.

17. The apparatus of claim 15, further comprising:
a transistor biased by a thermistor, the transistor adapted to decrease the feedback signal in response to an increased resistance in the thermistor.

18. An apparatus for amplifying an audio signal, comprising:
   a regulated switching power supply adapted to produce a positive and negative rail voltages in relation to a midpoint voltage, the regulated switching power supply including a peak current mode control system using a voltage error amplifier adapted to receive a feedback signal;

an audio frequency amplifier electrically connected to the midpoint and rail voltages of the regulated switching power supply and adapted to receive and amplify the audio signal;

a feedback generator connected between at least one rail and the midpoint voltage, the feedback generator adapted to proportionally divide the voltage between the midpoint voltage and the rail voltage to generate the feedback signal and a proportional reference voltage; and a fault detection circuit connected to the feedback generator and at least one rail voltage, the fault detection circuit adapted to detect a low impedance load on the amplifier and adjust the feedback generator's reference voltage to control the feedback signal such that the regulated switching power supply will lower the rail voltage to protect the amplifier.

19. The apparatus of claim 18, further comprising:

a capacitor;

a rectifier connected across the amplifier output and adapted to charge the capacitor with a voltage during one half of the alternating amplifier output a resistor adapted to at least partially discharge the capacitor during the second half of the amplifier output; and a transistor adapted to increase the feedback signal in response to excessive voltage on the capacitor.

20. The apparatus of claim 18, further comprising:

a zener diode electrically connected to the transistor and adapted to detect the excessive voltage on the capacitor to control current flow through the transistor.

* * * * *